United States Patent [19]

Johnson et al.

[11] Patent Number: 4,687,265
[45] Date of Patent: Aug. 18, 1987

[54] CONNECTOR FOR COMPONENT MOUNTED ON CIRCUIT BOARD

[75] Inventors: Curtis F. Johnson; Douglas J. Gilbert, both of Encinitas, Calif.

[73] Assignee: San Diego Levco Corporation, San Diego, Calif.

[21] Appl. No.: 868,762

[22] Filed: May 27, 1986

[51] Int. Cl.⁴ .............................................. H01R 23/72
[52] U.S. Cl. ........................................ 439/68; 439/329
[58] Field of Search ............. 339/17 CF, 74 R, 75 M, 339/75 MP, 92 M, 174; 324/158 P, 158 F

[56] References Cited

U.S. PATENT DOCUMENTS

| | | | |
|---|---|---|---|
| 2,543,140 | 2/1951 | Vickerman | 269/219 |
| 2,923,911 | 2/1960 | Demurjian | 339/75 MP |
| 3,955,867 | 5/1976 | Braun et al. | 339/17 CF |
| 4,047,780 | 9/1977 | Cedrone | 339/17 CF |
| 4,055,806 | 10/1977 | Patel | 324/158 F |

OTHER PUBLICATIONS

AP Products Inc. Information Sheet, The Low Profile Logical Connection, p. 6.

*Primary Examiner*—Neil Abrams

[57] ABSTRACT

An electrical connector for temporary attachment to two sets of linearly arrayed electrical contacts on opposite exposed sides of a rectangular-block-shaped electrical component, such as an integrated circuit chip, mounted on a circuit board. The electrical connector includes two sets of linealy arrayed conductive pins for connection to the first and second sets of contacts of the board-mounted component. Each set of pins is held by a slab of circuit-board material. When the connector is positioned over the board-mounted component for attachment thereto, a first end portion of each pin is disposed beneath its respective slab for connection to a corresponding contact of the electrical component, and the other end portion of each pin is exposed for connection to some other electrical component. With the slabs positioned over the board-mounted electrical component for attaching the connector thereto, a clamping mechanism is operated to force the first and second slabs toward each other in order to cause the first end portion of each pin to firmly press against the corresponding respective contact of the board-mounted electrical component. Pressing the slabs together counteracts the bending moment applied to the slabs by the pressure of the pins against the contacts. Extensions of end caps attached to the slabs are flush with the end portions of the pins that are disposed beneath the slabs so that the connector may be readily positioned with the pins in contact with contacts of a board-mounted component that only slightly rise above the surface of the board.

10 Claims, 4 Drawing Figures

CONNECTOR FOR COMPONENT MOUNTED ON CIRCUIT BOARD

BACKGROUND OF THE INVENTION

The present invention generally pertains to electrical connectors and is particularly directed to an electrical connector that is useful for temporary connection to an electrical component such as an integrated chip, that is mounted on a circuit board.

Typically, such an electrical component is of a rectangular-block shaped configuration and has first and second sets of linearly arrayed electrical contacts respectively positioned on opposite exposed sides of the component.

It sometimes is desirable for testing or operational purposes to temporarily connect the board-mounted component to some other electrical component(s) that are situated elsewhere; and electrical connectors have been developed for facilitating such connections. One such connector is a test clip having a pair of opposed slabs holding linear arrays of conductive pins. The slabs are joined by end-mounted leaf springs and positioned for connecting the pins to electrical contacts positioned on the opposite sides of the electrical component. However, such test clip requires the use of a custom application tool for flexing the test clip for enabling attachment to the board-mounted electrical component, and can be attached to only electrical components that are not mounted flush with the circuit board, since the electrical tool must grip between the component and the circuit board in order to attach the test clip to the component.

SUMMARY OF THE INVENTION

The present invention provides an improved electrical connector for temporary attachment to two sets of linearly arrayed electrical contacts on opposite exposed sides of a rectangular-block-shaped electrical component, such as an integrated circuit chip, mounted on a circuit board. The electrical connector of the present invention includes a first set of linearly arrayed conductive pins for connection to the first set of contacts; a first pin holder; a second set of linearly arrayed conductive pins for connection to the second set of contacts; a second pin holder; and a clamping mechanism for forcing the first and second holders together to cause the pins to firmly press against the contacts of the board-mounted electrical component. Each holder holds its respective set of pins in a spaced linear alignment, with the pins being spaced in accordance with the spacing of the corresponding contacts of the board-mounted electrical component. When the connector is positioned over the board-mounted electrical component for attachment thereto, a first end portion of each pin is disposed beneath its respective holder for connection to a corresponding contact of the electrical component, and the other end portion of each pin is exposed for connection to some other electrical component. With the first and second holders positioned over the board-mounted electrical component for attaching the connector thereto, the clamping mechanism is operated to force the first and second holders toward each other in order to cause the first end portion of each pin to firmly press against the corresponding respective contact of the board-mounted electrical component.

Each holder comprises a slab holding the pins in the spaced linear array and so dimensioned that when the first and second holders are positioned over the electrical component and forced together to cause the pins to press against the contacts of the board-mounted component, the slab of the first holder presses against the slab of the second holder to counteract a bending moment applied to the holders by the pressure of the pins against the contacts. As a result, firm contact pressure is maintained between the pins and the contacts.

In another aspect of the present invention, end caps secured to the ends of each slab include extensions that extend beneath the slab and are flush with the end portions of the pins that are disposed beneath the slabs so that the connector may be readily positioned with the pins in contact with contacts of a board-mounted component that only slightly rise above the surface of the board.

The improved connector of the present invention may be attached to circuit board-mounted electrical components that are flush with the board; and such attachment does not require any custom application tool. In the preferred embodiment the only application tool required is a simple Allen wrench.

Additional features of the present invention are described in relation to the description of the preferred embodiment.

DESCRIPTION OF THE PREFERRED EMBODIMENT

Figure 1:
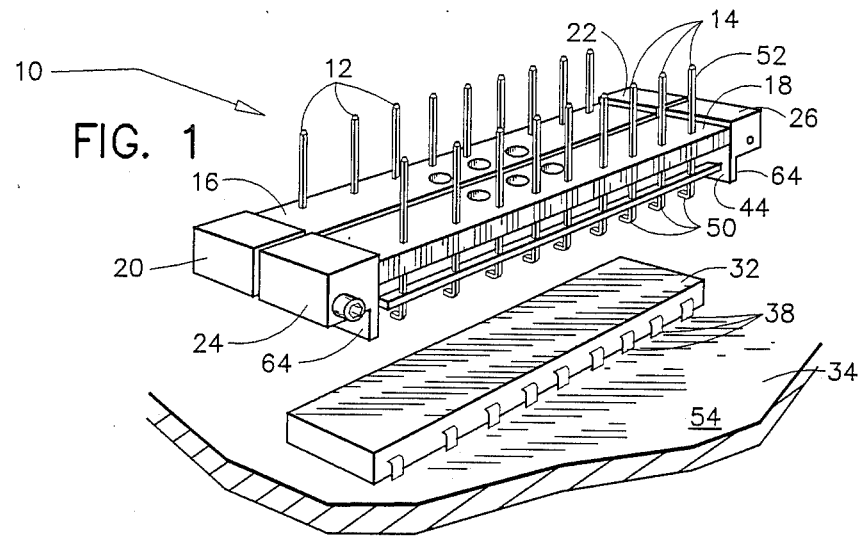
FIG. 1 is a perspective view showing a preferred embodiment of the electrical connector of the present invention oriented for attachment to an electrical component mounted on a circuit board.
Figure 2:
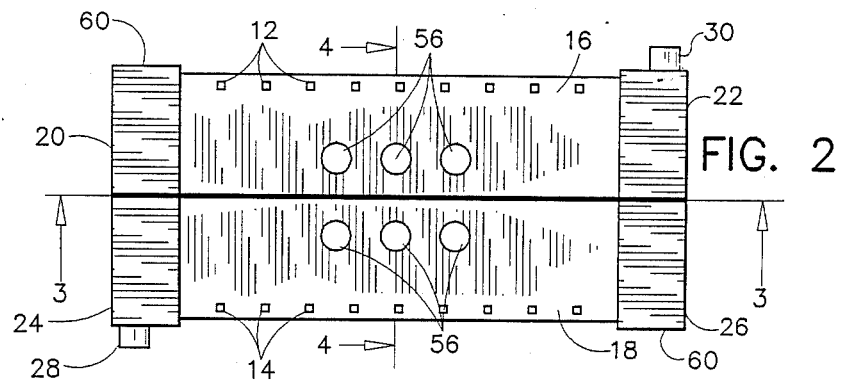
FIG. 2 is a top plan view of the electrical connector of FIG. 1.
Figure 3:
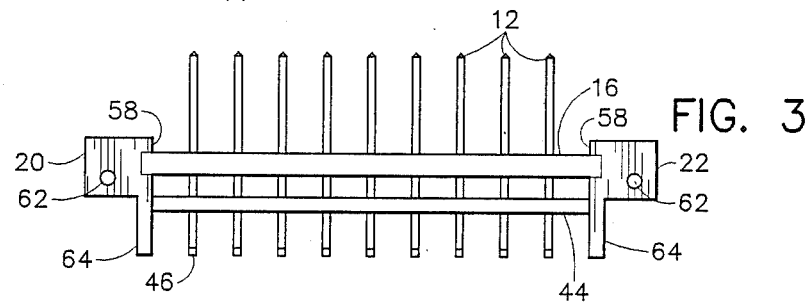
FIG. 3 is a sectional view taken along line 3—3 in FIG. 2.
Figure 4:
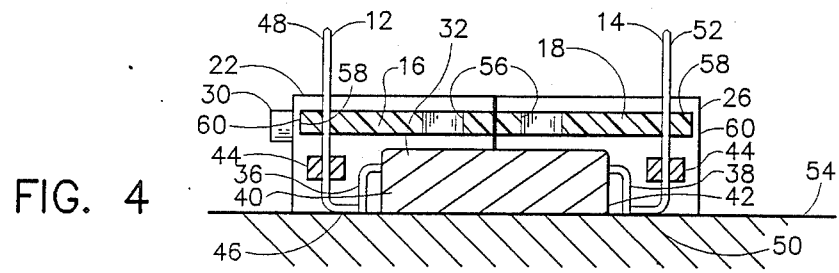
FIG. 4 is a sectional view taken along line 4—4 in FIG. 2.

Referring to the Drawing, the preferred embodiment of the electrical connector 10 of the present invention includes a first set of conductive pins 12, a second set of conductive pins 14, a first slab 16, a second slab 18, four end caps 20, 22, 24 and 26 and a pair of Allen-head screws 28 and 30. The connector 10 is oriented for attachment to an electrical component 32, such as an integrated circuit chip, mounted on a circuit board 34. The electrical component 32 has linearly arrayed electrical contacts 36, 38 on opposite exposed sides 40, 42 thereof.

The first set of conductive pins 12 is linearly arrayed for connection to the first set of contacts 36 of the board-mounted component 32. Although eight pins are shown in the pin sets 12, 14, it should be appreciated that the number of pins in each pin set is dependent upon the number of contacts on each exposed side 40, 42 of the board-mounted electrical component to which the connector 10 is to be attached.

The second set of conductive pins 14 is linearly arrayed for connection to the second set of contacts 38.

The pin sets 12, 14 are commercially available in linear arrays, wherein the pins are connected to and spaced by a rod 44. The spacing corresponds to the standard spacing between contacts on the exposed sides of integrated circuit chips.

The pins 12, 14 must be sufficiently strong and flexible to provide electrical contact with the contacts 36, 38 of the board-mounted component 32, and to assure a high pressure grip upon the contacts 36, 38. Each pin 12, 14 must also have sufficient compliance and act independently of every other pin. The pins 12, 14 can include single or bifurcated ends 46, 48, 50, 52 and may be plated or unplated.

The slabs 16 and 18 function as holders for the pin sets 12, 14 for the purpose of attaching the pins to the contacts 36, 38 of a board-mounted component 32.

The first slab 16 holds the first set of pins 12 in a spaced linear alignment, with the pins 12 being spaced in accordance with the spacing of the first set of contacts 36 of the board-mounted component 32. A first end 46 of each pin 12 is disposed beneath the first slab 16 for connection to a corresponding contact 36 of the board-mounted component 32 when the first slab 16 is positioned over the board-mounted component 32 for attaching the connector 10 thereto. See FIG. 1, wherein the connector 10 is oriented for positioning over the board-mounted component 32. The other end 48 of each pin 12 is exposed for connection to some other electrical component (not shown) when the first slab 16 is positioned over the board-mounted component 32 for attaching the connector 10 thereto.

The second slab 18 holds the second set of pins 14 in a spaced linear alignment, with the pins 14 being spaced in accordance with the spacing of the second set of contacts 38 of the board-mounted component 32. A first end 50 of each pin 14 is disposed beneath the second slab 18 for connection to a corresponding contact 38 of the board-mounted component 32 when the second slab 18 is positioned over the board-mounted component 32 for attaching the connector 10 thereto. The other end 52 of each pin 14 is exposed for connection to some other electrical component (not shown) when the second slab 18 is positioned over the board-mounted component 32 for attaching the connector 10 thereto.

The end caps 20, 22, 24, 26 and the screws 28, 30 form a clamping mechanism for forcing the first and second slabs 16, 18 toward each other when the first and second slabs 16, 18 are positioned over the board-mounted component 32 for attaching the connector 10 thereto to cause the first end 46, 50, of each pin 12, 14, to firmly press against the corresponding contact 36, 38 of the board-mounted component 32.

Each pin 12, 14 is bent and so oriented in its respective slab 16, 18 that when the first and second slabs 16, 18 are positioned over the board-mounted component 32 and forced together to cause the pins 12, 14 to press against the contacts 36, 38 of the board-mounted component 32, the first end portion 46, 50, of each pin 12, 14, beyond the bend is parallel to the surface 54 of the board 34 adjacent the board-mounted component 32 to concentrate the contact pressure between the pins 12, 14 and the contacts 36, 38.

The slabs 16, 18 are so dimensioned that when the slabs 16, 18 are positioned over the board-mounted component 32 and forced together to cause the pins 12, 14 to press against the contacts 36, 38 of the board-mounted component 32, the first slab 16 presses against the second slab 18 to counteract a bending moment applied to the slabs 16, 18 by the pressure of the pins 12, 14 against the contacts 36, 38. The slabs 16, 18 are dimensioned to contact each other over the full length of the linearly arrayed pin sets 12, 14 held by the slabs 16, 18. The slabs 16, 18 are constructed of standard printed-circuit-board material, such as fiberglass or polysulfone. The slabs 16, 18 have sufficient strength to carry the high stresses caused by the bending moments of the pins 12, 14. Each slab 16, 18 contains a plurality of holes 56 positioned along the longitudinal centerline of the slab 16, 18 for ventilating heat. By so positioning the holes 56, the holes 56 do not impair the strength of the slabs 16, 18.

The end caps 20 22 are secured at the ends of the first slab 16 and the end caps 24, 26 are secured at the ends of the second slab 18. Each end cap has a slot 58 into which the respective slab 16, 18 is fitted. The outside wall 60 of each end cap defines an end wall of each slot 58 for preventing the slabs 16, 18 from sliding out through the end caps as the the end caps are clamped together.

Each end cap 20, 22, 24, 26 includes holes 62. The holes 62 in the end caps 20, 22 secured to the first slab 16 are coaxial with the holes 62 in the adjacent end caps 24, 26 secured to the other slab 18 when the slabs 16, 18 are positioned over the board-mounted component 32 and forced together to cause the pins 12, 14 to press against the contacts 36, 38 of the board-mounted component 32. The end caps 20, 22, 24, 26 are made of plastic or some other insulative material so as not to effect the circuit connections of the circuit board 34. The preferred end-cap material is glass-filled polycarbonate plastic material, which provides structural rigidity. Such material is readily bonded to the slab material by an epoxy adhesive.

The screws 28, 30 pass through the holes 62 of the end caps 20, 22, 24, 26 for clamping the end caps to force the slabs 16, 18 together.

Preferably, the hole 62 in at least one end cap of each pair of adjacent end caps 20, 24 and 22, 26 is threaded, and the screws 28, 30 are case-hardened Allen-head screws. The use of Allen-head screws enhances the use of the connector with a cramped board-mounted component.

Each end cap 20, 22, 24, 26 includes an extension 64 beyond the portion of the end cap that holds the slab 16, 18. The extensions 64 connected to a given slab 16, 18 are separated by the length of the electrical component 32 for use with which the connector 10 is designed. As a result, the pins 12, 14 are automatically aligned with the contacts 36, 38 of the board-mounted component 32.

The extensions 64 are substantially flush with the first end portions 46, 50 of the pins 12, 14 so that when the slabs 16, 18 are positioned over the board-mounted component 32 and forced together to cause the pins 12, 14 to press against the contacts 36, 38 of the board-mounted component 32, the first end portions 46, 50 of the pins 12, 14 may make contact with contacts 36, 38 that only slightly rise above the surface 54 of the board 34.

The clamping mechanism enables the connector 10 to be used with low profile design board-mounted components; and allows for easy installation in the field without the need for custom application tools. The connector is easy to attach, and can be used by someone without any special technical skills. It also is self-aligning.

The connector 10 of the present invention allows components mounted on one circuit board to be connected to off-board components without having to modify the board-mounted components. Thus, a board-mounted circuit can be readily modifyied without having to alter and possibly impair the warranty and serviceability of the board-mounted circuit.

The connector 10 of the present invention is inexpensive to produce with readily available parts, such as commercially available screws and pin sets, that need only be bent, and slabs and end caps that are easily manufactured in standard industry shops. Very little special tooling is required.

The connector 10 of the present invention is reusable, non-destructive and self-supporting. It forms a high-pressure contact between the pins and the contacts of the board-mounted component 32. It works with a variety of packaging styles, including plastic or ceramic DIP's, SIP's and ZIP's.

The connector 10 of the present invention can be used to connect the boardmounted component 32 to an off-board component that is not necessarily socketed, such as a test pod.

The connector 10 of the present invention allows the signals provided from the board-mounted component 32 via the pins 12, 14 to be individually shielded, impedance controlled, rearranged, monitored, amplified, processed and terminated.

The connector 10 of the present invention allows many different options for mounting and pin configurations and may be adapted to suit different application requirements.

What is claimed is:

1. An electrical connector useful for temporary attachment to first and second sets of linearly arrayed electrical contacts on opposite exposed sides of a rectangular-block-shaped electrical component, such as an integrated circuit chip, mounted on a circuit board, comprising
    a first set of linearly arrayed conductive pins for connection to the first set of contacts;
    a second set of linearly arrayed conductive pins for connection to the second set of contacts;
    first holding means for holding the first set of pins in a spaced linear alignment, with the pins being spaced in accordance with the spacing of the first set of contacts of the board-mounted component, with a first end portion of each pin being disposed beneath the first holding means for connection to a corresponding contact of the board-mounted component when the first holding means is positioned over the board-mounted component for attaching the connector thereto, and with the other end portion of each pin being exposed for connection to some other electrical component when the first holding means is positioned over the board-mounted component for attaching the connector thereto;
    second holding means for holding the second set of pins in a spaced linear alignment with the pins being spaced in accordance with the spacing of the second set of contacts of the board-mounted component, with a first end portion of each pin being disposed beneath the second holding means for connection to a corresponding contact of the board-mounted component when the second holding means is positioned over the board-mounted component for attaching the connector thereto, and with the other end portion of each pin being exposed for connection to some other electrical component when the second holding means is positioned over the board-mounted component for attaching the connector thereto; and
    clamping means for forcing the first and second holding means toward each other when the first and second holding means are positioned over the board-mounted component for attaching the connector thereto to cause the first end portion of each pin to firmly press against the corresponding contact of the board-mounted component;
    wherein each holding means comprises a slab holding the pins in the spaced linear array and so dimensioned that when the holding means are positioned over the board-mounted component and forced together to cause the pins to press against the contacts of the board-mounted component, the slab of the first holding means presses against the slab of the second holding means to counteract a bending moment applied to the holding means by the pressure of the pins against the contacts.

2. A connector according to claim 1, wherein each pin is bent and so oriented in the respective holding means that when the first and second holding means are positioned over the board-mounted component and forced together to cause the pins to press against the contacts of the board-mounted component, the first end portion of each pin beyond the bend is parallel to the surface of the board adjacent the board-mounted component to concentrate the contact pressure between the pins and the contacts.

3. A connector according to claim 1, wherein the compression means comprises
    end caps secured at the end of each slab and defining holes that are coaxial with the holes in the adjacent end caps of the other slab when the holding means are positioned over the board-mounted component and forced together to cause the pins to press against the contacts of the board-mounted component; and
    means passing through the holes of the end caps for clamping the end caps to force the boards together.

4. A connector according to claim 3, wherein the hole in at least one end cap of each pair of adjacent end caps is threaded and wherein the clamping means comprises an Allen-head screw.

5. A connector according to claim 1, comprising end caps secured at the end of each slab with each of the end caps including an extension extending beneath the slab toward the circuit board when the holding means are positioned over the board-mounted component and forced together to cause the pins to press against the contacts of the board-mounted component wherein said extensions of the end caps secured to each slab are separated by the length of the electrical component in order to self-align the pins with the contacts when the connector is attached to the board-mounted component.

6. An electrical connector useful for temporary attachment to first and second sets of linearly arrayed electrical contacts on opposite exposed sides of a rectangular-block-shaped electrical component, such as an integrated circuit chip, mounted on a circuit board, comprising
    a first set fo linearly arrayed conductive pins for connection to the first set of contacts;
    a second set of linearly arrayed conductive pins for connection to the second set of contacts;
    first holding means for holding the first set of pins in a spaced linear alignment, with the pins being spaced in accordance with the spacing of the first set of contacts of the board-mounted component, with a first end portion of each pin being disposed beneath the first holding means for connection to a corresponding contact of the board-mounted component when the first holding means is positioned over the board-mounted component for attaching the connector thereto, and with the other end portion of each pin being exposed for connection to some other electrical component when the first holding means is positioned over the board-mounted component for attaching the connector thereto;

second holding means for holding the second set of pins in a spaced linear alignment, with the pins being spaced in accordance with the spacing of the second set of contacts of the board-mounted component, with a first end portion of each pin being disposed beneath the second holding means for connection to a corresponding contact of the board-mounted component when the second holding means is positioned over the board-mounted component for attaching the connector thereto; and with the other end portion of each pin being exposed for connection to some other electrical component when the second holding means is positioned over the board-mounted component for attaching the connector thereto; and clamping means for forcing the first and second holding means toward each other when the first and second holding means are positioned over the board-mounted component for attaching the connector thereto to cause the first end portion of each pin to firmly press against the corresponding contact of the board-mounted component;

wherein each holding means comprises a slab holding the pins in the spaced linear array; and end caps secured at the end of each slab with each of the end caps including an extension extending beneath the slab toward the circuit board when the holding means are positioned over the board-mounted component and forced together to cause the pins to press against the contacts of the board-mounted component, wherein said extensions of the end caps secured to each slab are flush with the first end portions of the pins that press against the contacts of the board-mounted component.

7. A connector according to claim 6, wherein each pin is bent and so oriented in the respective holding means that when the first and second holding means are positioned over the board-mounted component and forced together to cause the pins to press against the contacts of the board-mounted component, the first end portion of each pin beyond the bend is parallel to the surface of the board adjacent the board-mounted component to concentrate the contact pressure between the pins and the contacts.

8. A connector according to claim 6, wherein the compression means comprises end caps secured at the end of each slab and defining holes that are coaxial with the holes in the adjacent end caps of the other slab when the holding means are positioned over the board-mounted component and forced together to cause the pins to press against the contacts of the board-mounted component; and means passing through the holes of the end caps for clamping the end caps to force the boards together.

9. A connector according to claim 8, wherein the hole in at least one end cap of each pair of adjacent end caps is threaded and wherein the clamping means comprises an Allen-head screw.

10. A connector according to claim 6, wherein said extensions of the end caps secured to each slab are separated by the length of the electrical component in order to self-align the pins with the contacts when the connector is attached to the board-mounted component.

* * * * *